US007224583B2

(12) United States Patent
Marumoto

(10) Patent No.: US 7,224,583 B2
(45) Date of Patent: May 29, 2007

(54) SHIELDING BOX WITHOUT ANY DEDICATED COOLING DUCT

(75) Inventor: Takeshi Marumoto, Osaka (JP)

(73) Assignee: Kyocera Mita Corporation, Osaka (JP)

( * ) Notice: Subject to any disclaimer, the term of this patent is extended or adjusted under 35 U.S.C. 154(b) by 185 days.

(21) Appl. No.: 11/131,199

(22) Filed: May 18, 2005

(65) Prior Publication Data

US 2005/0264993 A1 Dec. 1, 2005

(30) Foreign Application Priority Data

May 28, 2004 (JP) ............................ 2004-159050

(51) Int. Cl.
*H05K 7/20* (2006.01)

(52) U.S. Cl. ...................................................... 361/690

(58) Field of Classification Search ................ 361/690, 361/687, 683, 695; 439/67, 487, 492, 498
See application file for complete search history.

(56) References Cited

U.S. PATENT DOCUMENTS 5,168,171 A * 12/1992 Tracewell .................... 307/64
5,218,514 A * 6/1993 Huynh et al. ............... 361/683
5,333,097 A * 7/1994 Christensen et al. ........ 361/685
5,390,734 A * 2/1995 Voorhes et al. ............. 165/185
6,018,456 A * 1/2000 Young et al. ............... 361/684
6,288,897 B1 * 9/2001 Fritschle et al. ............ 361/687
6,359,779 B1 * 3/2002 Frank et al. ................ 361/687
6,452,797 B1 * 9/2002 Konstad ..................... 361/695
6,592,380 B2 * 7/2003 Miyazawa et al. ............ 439/67
6,840,801 B1 * 1/2005 Behl ....................... 439/541.5
6,947,281 B2 * 9/2005 Wrycraft et al. ............ 361/695
7,009,835 B2 * 3/2006 Desai et al. ................ 361/683
7,150,644 B2 * 12/2006 Behl .......................... 439/374

FOREIGN PATENT DOCUMENTS

JP 2002-23597 1/2002

* cited by examiner

*Primary Examiner*—Chandrika Prasad
(74) *Attorney, Agent, or Firm*—Smith, Gambrell & Russell, LLP

(57) ABSTRACT

A shielding box includes a first wiring board and a second wiring board maintaining a distance relative to the first wiring board and facing thereto. A ventilating hole is formed in the second wiring board and having side surfaces facing each other. A pair of flat cables are extending through the insides of the side surfaces of the ventilating hole and are facing each other, the ends on one side thereof being connected to the first wiring board and the ends on the other side thereof being connected to the second wiring board. A cooling fan is disposed so as to blow the external air toward the first wiring board passing through the pair of flat cables.

10 Claims, 8 Drawing Sheets

SHIELDING BOX WITHOUT ANY DEDICATED COOLING DUCT

BACKGROUND OF THE INVENTION

1. Field of the Invention

The present invention relates to a shielding box provided for an electronic control apparatus such as an image-forming machine which is a composite machine as represented by an electrostatic copier, a laser printer or a facsimile.

2. Description of the Related Art

A wiring board on which there is arranged a digital circuitry of an image-forming machine which is a composite machine such as an electrostatic copier, a laser printer or a facsimile, is, generally, contained in a shielding box to satisfy the Standards for Radiant Electromagnetic Waves. A CPU is mounted on the wiring board. Accompanying the advancement in the high-speed processing of modern electronic equipment, the clock frequency of the CPU is ever increasing, too, accompanied, however, by an increase in the amount of heat generated by the CPU and an increase in the surface temperature. If this state is left to stand, the CPU undergoes the thermal runaway and the electronic equipment malfunctions. Therefore, cooling becomes necessary.

JP-A-2002-23597 discloses an image-forming machine having a constitution in which a cooling fan is mounted on a shielding box, the external air is taken into the machine body by the cooling fan, and the external air is partly fed into the shielding box to cool the wiring board. In this shielding box, the external air taken in by the cooling fan is partly fed into the shielding box without, however, primarily cooling the surface of the CPU. In particular, when a plurality of, e.g., two pieces of wiring boards are mounted maintaining a distance and facing each other on the machine body being contained in the shielding box and when the CPU is arranged on the wiring board positioned on the side of the machine body, it becomes necessary to take a countermeasure such as providing a dedicated duct for cooling the CPU or increasing the blowing rate of the cooling fan to primarily cool the surface of the CPU. As a result, the constitution becomes complex and bulky boosting up the cost. The above technical problem similarly exists even when the member that must be primarily cooled is a particular member that needs cooling other than the CPU.

SUMMARY OF THE INVENTION

It is an object of the present invention to provide a novel shielding box which makes it possible to primarily and efficiently cool a particular member that needs cooling (e.g., CPU) without providing any special dedicated duct.

According to one aspect of the invention, there is provided a shielding box including a first wiring board and a second wiring board maintaining a distance relative to the first wiring board and facing thereto in parallel, the shielding box further comprising:

a ventilating hole formed in the second wiring board and having side surfaces substantially facing each other;

a pair of flat cables extending through the insides of the side surfaces of the ventilating hole and facing each other maintaining a distance, the ends on one side thereof being connected to the first wiring board and the ends on the other side thereof being connected to the second wiring board; and a cooling fan disposed so as to be faced to the ventilating hole and blows the external air toward the first wiring board passing through the pair of flat cables.

It is desired that a particular member that needs cooling is disposed on an extension of a space defined by the pair of flat cables facing each other.

It is desired that the particular member that needs cooling is a CPU.

It is desired that the side surfaces of the ventilating hole are extending in parallel with each other.

It is desired that the side surfaces of the ventilating hole are so formed that the distance therebetween gradually increases from the ends on one side to the ends on the other side.

It is desired that the ventilating hole in the second wiring board has one end surface extending across the ends on one side of the side surfaces thereof, another flat cable is disposed in addition to the pair of flat cables, the another flat cable extending through the inside of the one end surface of the ventilating hole and being connected at its one end to the first wiring board and connected at its other end to the second wiring board, and the another flat cable being so disposed as to substantially form a channel shape in transverse cross section in cooperation with the pair of flat cables.

According to another aspect of the invention, there is provided a shielding box including a first wiring board and a second wiring board maintaining a distance relative to the first wiring board and facing thereto in parallel, the shielding box further comprising:

a ventilating hole formed in the second wiring board and having side surfaces substantially facing each other;

a flat cable extending through the inside of one of the side surfaces of the ventilating hole, the end on one side thereof being connected to the first wiring board and the end on the other side thereof being connected to the second wiring board; and a cooling fan disposed so as to be faced to the ventilating hole and blows the external air toward the first wiring board through the ventilating hole along the flat cable.

It is desired that the flat cable is extending toward the first wiring board being tilted from one side surface of the ventilating hole toward the other side thereof.

It is desired that a particular member that needs cooling is disposed on the first wiring board at a position facing the inner side surface of the flat cable that faces the other side surface of the ventilating hole.

It is desired that the particular member that needs cooling is a CPU.

DETAILED DESCRIPTION OF THE PREFERRED EMBODIMENTS

A preferred embodiment of the shielding box constituted according to the present invention will now be described in detail with reference to the accompanying drawings.

Figure 1:
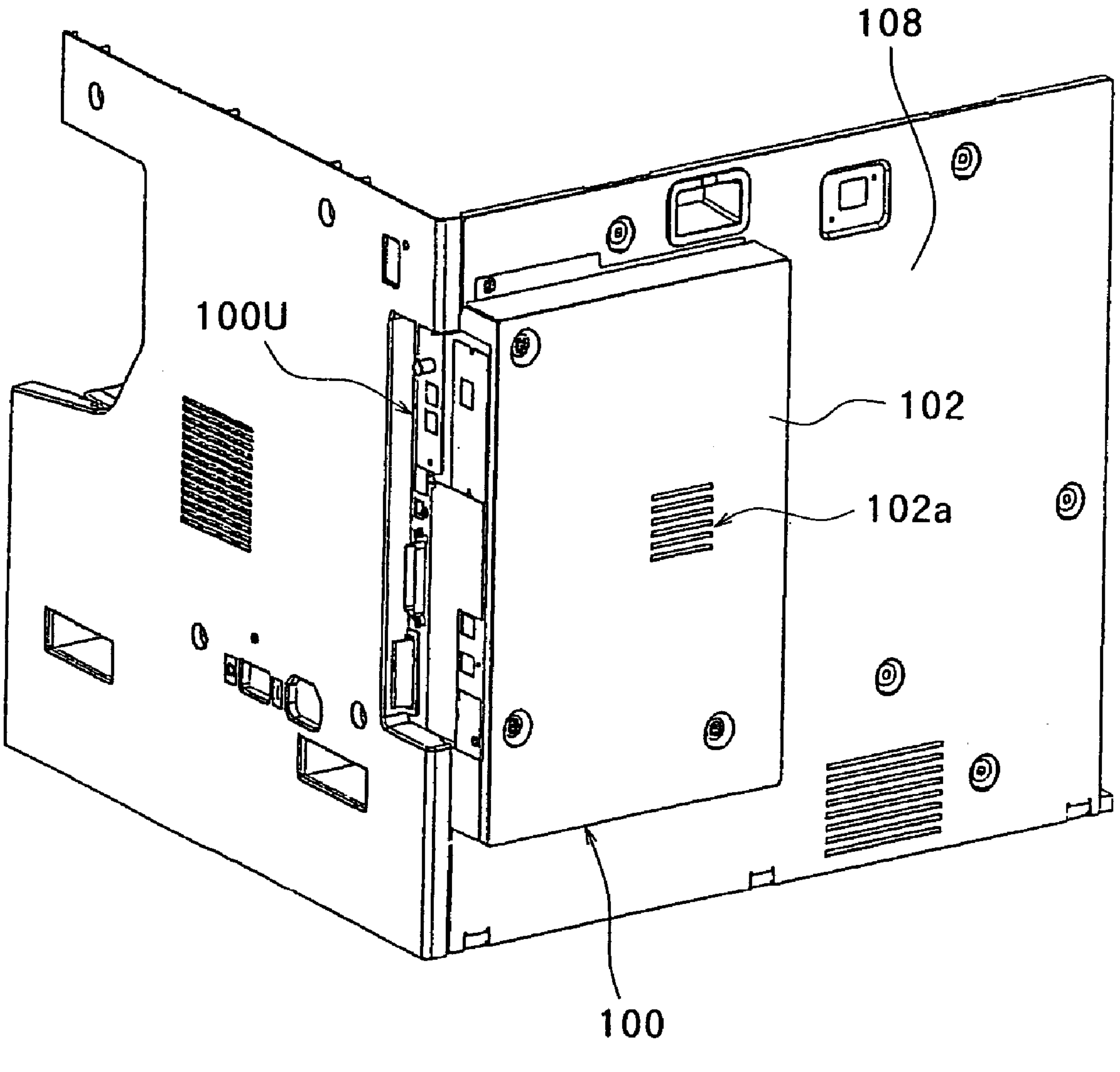
FIG. 1 is a perspective view illustrating a state where a shielding box constituted according to the present invention is mounted on a frame positioned on the side of the back portion of an image-forming machine body.
Figure 2:
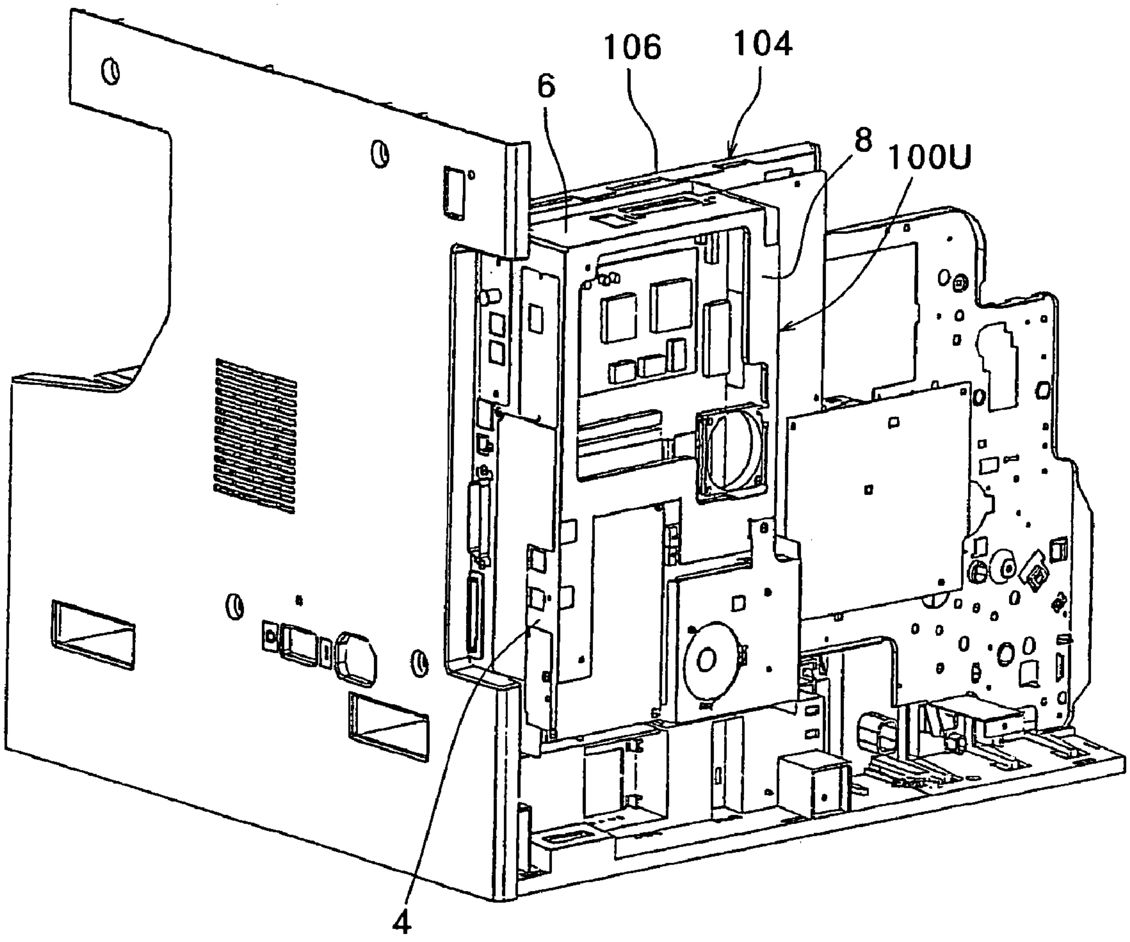
FIG. 2 is a perspective view illustrating a state where an outer frame cover and an outer box cover shown in FIG. 1 are removed from the frame (state where a shielding box unit is mounted on the frame)
Figure 3:
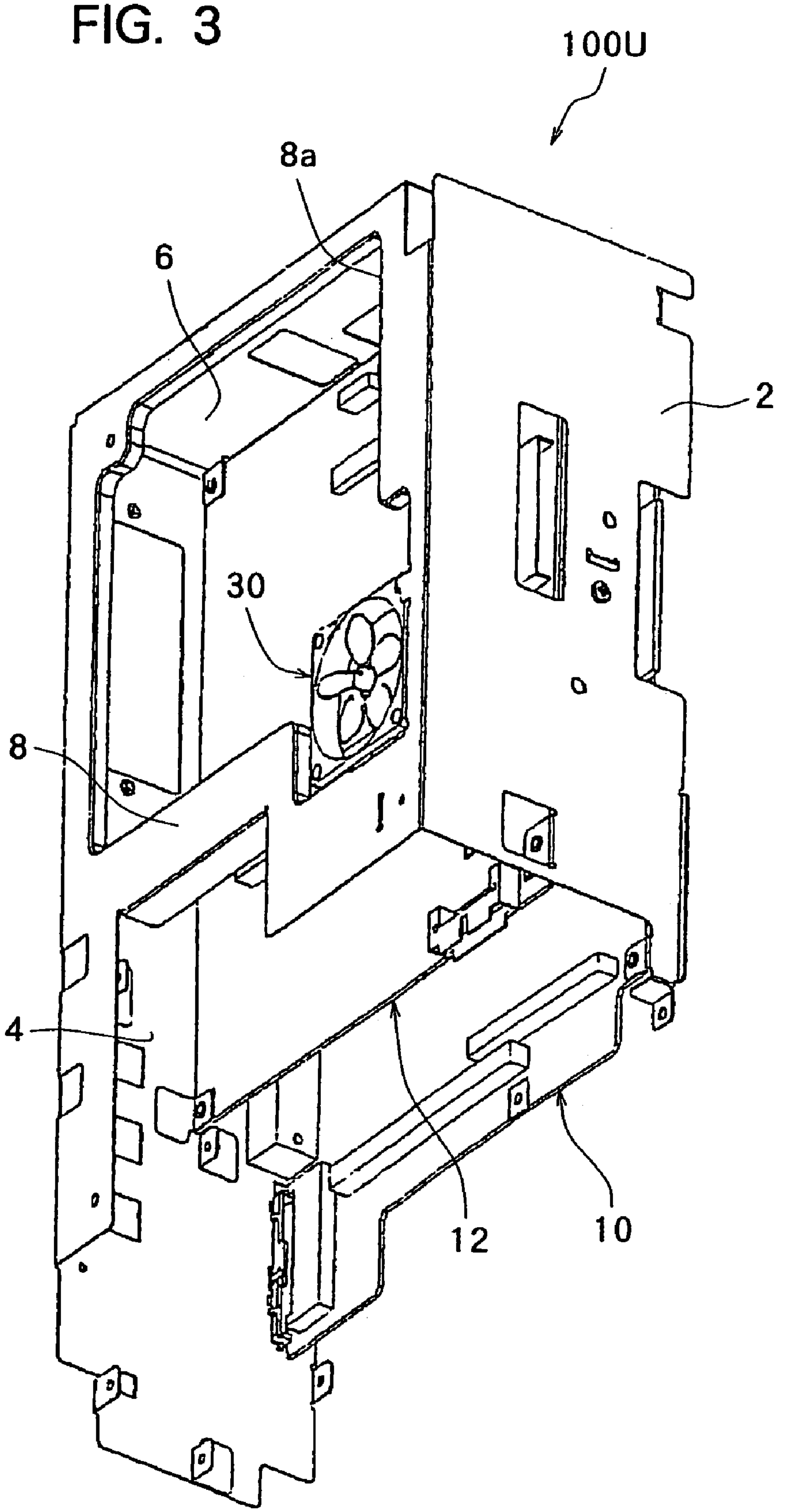
FIG. 3 is a perspective view illustrating a state where the shielding box unit shown in FIG. 2 is removed from the frame.
Figure 4:
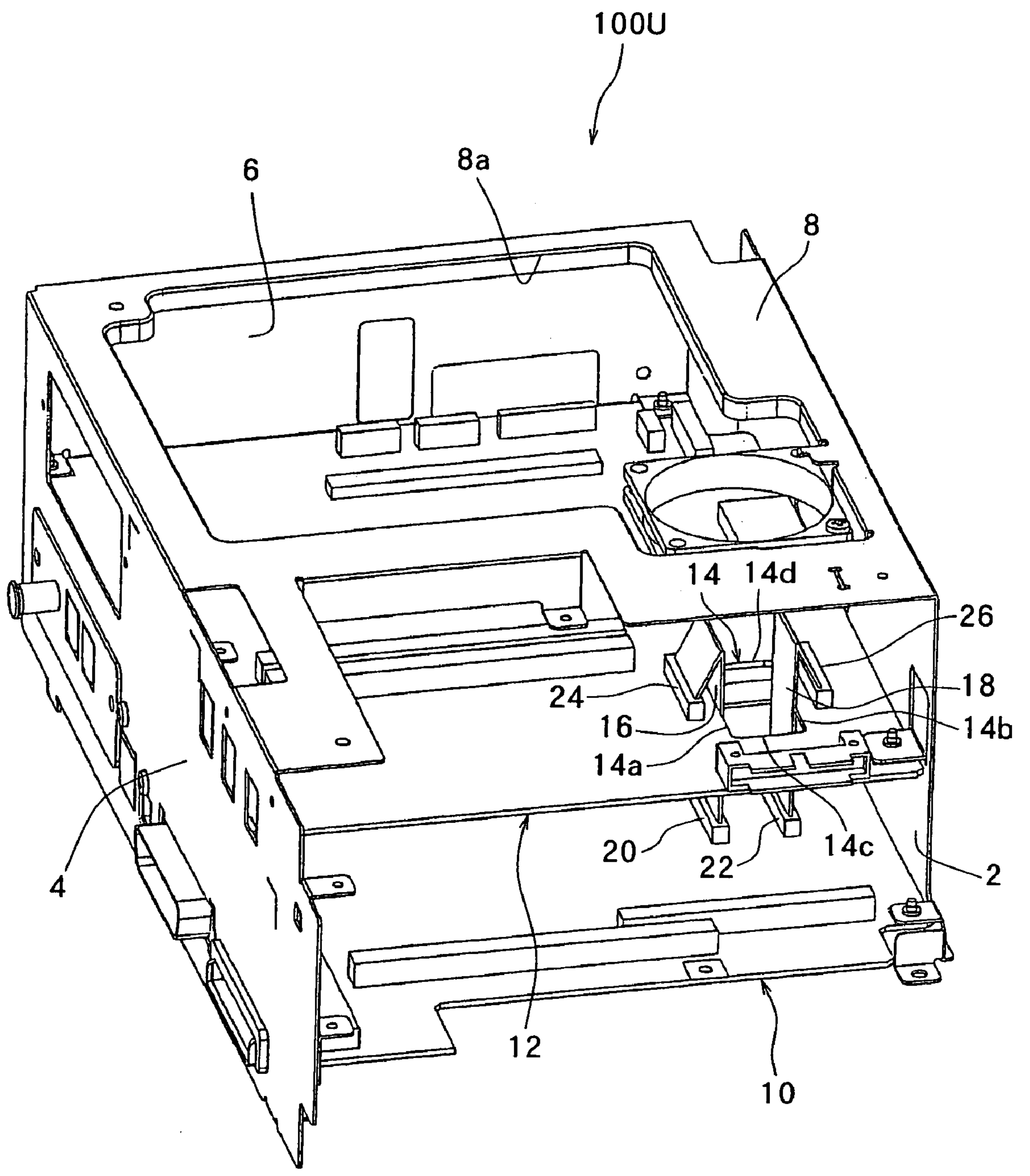
FIG. 4 is a perspective view illustrating, on an enlarged scale, the shielding box of FIG. 3 from a different angle.

Referring to FIGS. 1 to 4, a shielding box 100 includes a shielding box unit 100U and an outer box cover 102. The shielding box unit 100U includes side plates 2 and 4 of nearly a rectangular shape facing each other maintaining a distance and extending in the lengthwise direction (up-and-down direction in FIGS. 2 and 3) maintaining a predetermined width, an end plate 6 of nearly a rectangular shape extending in the transverse direction (nearly right-and-left direction in FIGS. 2 and 3) across the ends on one side in the lengthwise direction of the side plates 2 and 4 (across the upper ends in FIGS. 2 and 3), and a front plate 8 disposed on one side of the side plates 2, 3 and of the end plate 6 in the direction of width thereof. A large opening 8*a* is formed in the front plate 8 leaving the peripheral edge portions. The side plates 2, 4, end plate 6 and front plate 8 are made of metal plates. A first wiring board 10 of nearly a rectangular shape is mounted on the inside, which is the other side, of the side plates 2, 4 and of the end plate 6 in the direction of width. The first wiring board 10 is disposed maintaining a distance relative to the front plate 8 and in parallel therewith. A second wiring board 12 of nearly a rectangular shape is mounted inside of the side plates 2, 4 and of the end plate 6 at an intermediate portion in the direction of width thereof. The second wiring board 12 is disposed maintaining a distance to the first wiring board 10 and in parallel therewith. In FIGS. 2 and 3, the shielding box unit 100U is opened on the lower end side thereof. The shielding box unit 100U will be described later in detail.

The shielding box unit 100U is detachably mounted (see FIG. 2), i.e., the back surface of the first wiring board 10 of the shielding box unit 100U is superposed on the back surface of the frame 106 located on the back surface side of the apparatus of the metallic frame 104 of nearly an L-shape disposed at the corner of the side surface and the back surface of the image-forming machine (not shown) which is a composite machine such as an electrostatic copier, a laser printer or a facsimile.

In a state where the shielding box unit 100U is mounted on the frame 106, the opening 8*a* in the front plate 8 is facing the back surface side. Referring to FIG. 1, an outer frame cover 108 is detachably mounted on the back surface side of the frame 106. The outer frame cover 108 is so disposed as to cover the upper side, right side and lower side of the shielding box unit 100U in FIG. 2. In this state, the metallic outer box cover 102 of a rectangular shape is mounted on the shielding box unit 100U and on the outer frame cover 108 so as to cover the front plate 8 and the lower end side of the shielding box unit 100U (see FIG. 1). The first wiring board 10 and the second wiring board 12 in the shielding box unit 100U are shielded in nearly a rectangular parallelopiped space defined by the side plates 2, 4, end plate 6, front plate 8, outer box cover 102 and frame 106 of the shielding box unit 100U.

Figure 7:
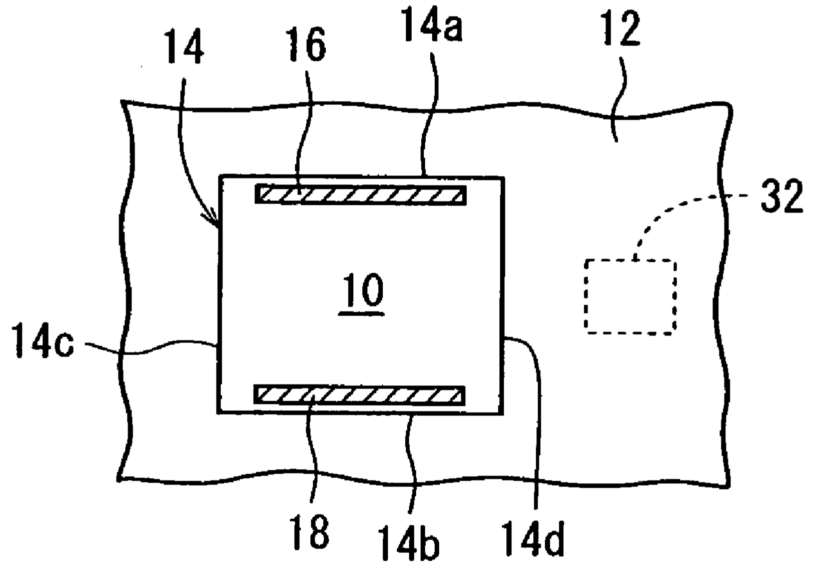
FIG. 7 is a schematic sectional view along A—A in FIG. 6.

The shielding box unit 100U will be further described with reference to FIGS. 3 to 5 and 7. A ventilating hole 14 is formed in the second wiring board 12, the ventilating hole 14 having side surfaces substantially facing each other. In this embodiment as shown in FIG. 7, the ventilating hole 14 is formed in a rectangular shape having one side surface 14*a* and the other side surface 14*b* facing in parallel with each other, and having one end surface 14*c* and the other end surface 14*d* facing in parallel with each other. The one end surface 14*c* extends across the one end of the one side surface 14*a* and one end of the other side surface 14*b*, and the other end surface 14*d* extends across the other end of the one side surface 14*a* and the other end of the other side surface 14*b*. The first wiring board 10 (circuit of which) and the second wiring board 12 (circuit of which) are connected together through a pair of flat cables 16 and 18. The circuit of the first wiring board 10 is disposed on the surface (circuit surface) facing the second wiring board 12, and the circuit of the second wiring board 12 is disposed on the surface (circuit surface) on the side opposite to the surface that is facing the second wiring board 12. The flat cables 16 and 18 are extending maintaining a distance and facing relative to each other penetrating through the insides of the one side surface 14*a* and of the other side surface 14*b* of the ventilating hole 14, and are connected at the ends on one side to the circuit surface of the first wiring board 10 via connectors 20 and 22, and are connected at the ends on the other side to the circuit surface of the second wiring board 12 via connectors 24 and 26.

Figure 5:
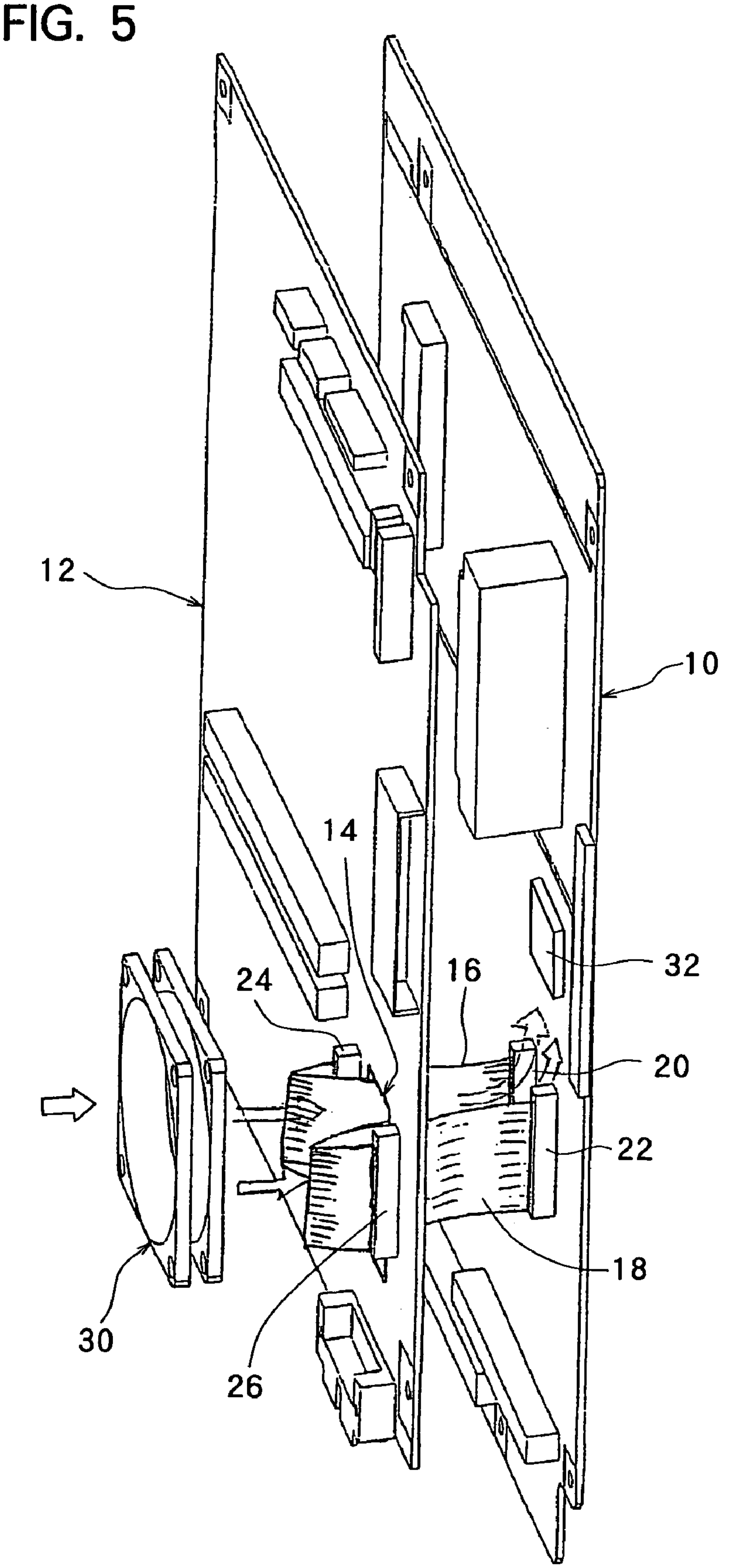
FIG. 5 is a perspective view illustrating major portions of the shielding box shown in FIG. 4 in a disassembled manner to explain the cooling operation in the shielding box.

The ends on the other side of the flat cables 16 and 18 are extending from the circuit surface of the second wiring board 12, are facing each other being gradually curved in a direction to separate away from each other, and are folded toward the back surface side of the surfaces facing each other. The ends on the other side of the flat cables 16 and 18 folded and approaching the circuit surface of the wiring board 12, are connected to the circuit of the second wiring board 12 via the connectors 24 and 26. The ends on one side of the flat cables 16 and 18 extend in a state of facing each other nearly at right angles with the circuit surface of the first wiring board 10, and are connected to the circuit of the first wiring board 10 via the connectors 20 and 22. Thus, an air flow passage is formed by the flat cables 16 and 18 between the second wiring board 12 and the first wiring board 10 from the outer side of the second wiring board 12 passing through the ventilating hole 14 extending toward the circuit surface of the first wiring board 10. Referring to FIGS. 5 and 7, a CPU 32 is disposed on the circuit surface of the first wiring board 10 on one side thereof (upper side in FIG. 5 or right side in FIG. 7) on an extension (up-and-down direction in FIG. 5 or right-and-left direction in FIG. 7) of the space defined by the pair of flat cables 16 and 18 facing each other.

On the shielding box unit 100U, a cooling fan 30 which is an axial fan is disposed facing the ventilating hole 14 in the axial direction in a manner to blow the external air onto the circuit surface of the first wiring board 10 through the pair of flat cables 16 and 18. If described more concretely, the cooling fan 30 is mounted inside the front plate 8 of the shielding box unit 100U facing the ventilating hole 14 in the axial direction. The intake side of the cooling fan 30 (upper side in FIG. 4) is facing part of the region of the opening 8*a* in the front plate 8. In a state where the front plate 8 of the shielding box unit 100U is covered by the outer box cover 102 as shown in FIG. 1, a louver 102*a* comprising a plurality of intake ports formed in the outer box cover 102 is positioned being corresponded to the cooling fan 30 in the axial direction.

Figure 6:
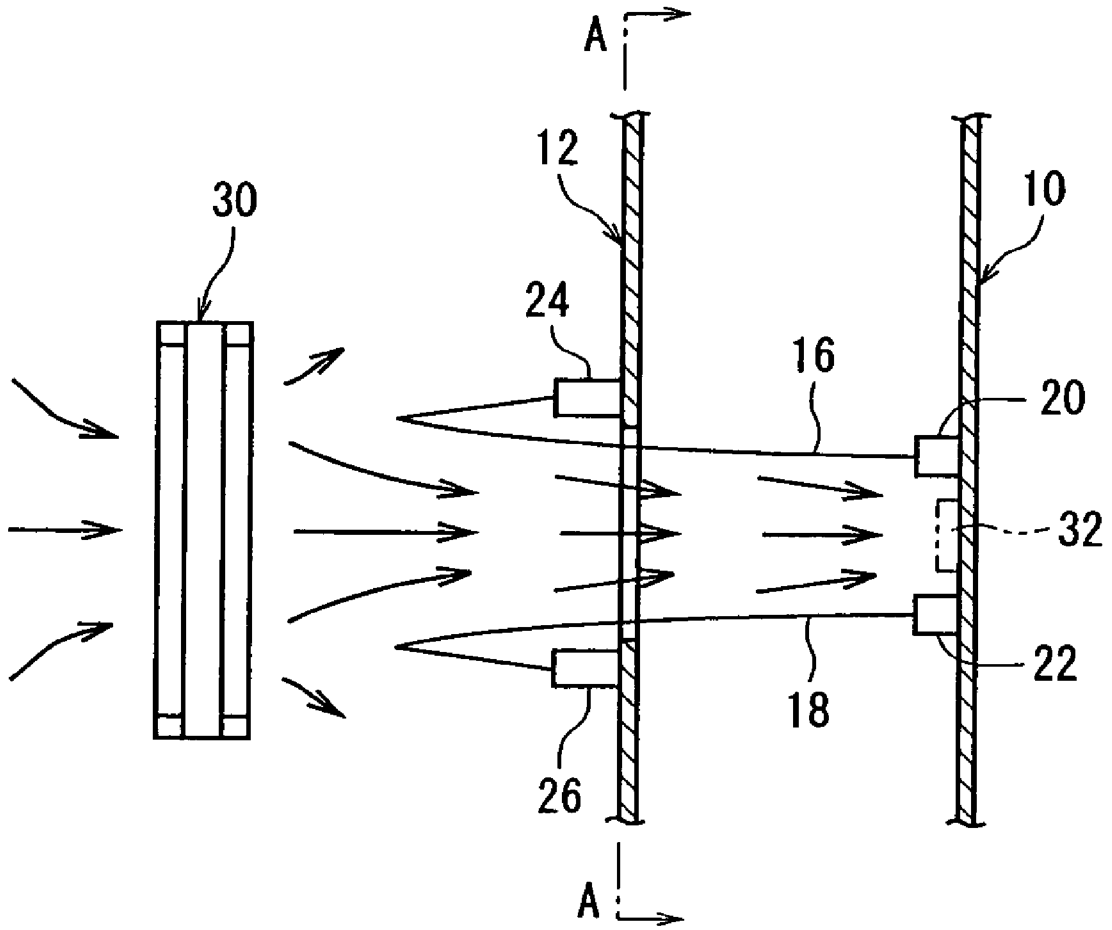
FIG. 6 is a longitudinal sectional view schematically illustrating part of the interior of the shielding box shown in FIG. 5 along the direction in which the flat cable extends to explain the cooling operation.

Referring to FIG. 1, when the cooling fan 30 is rotated in a state where the shielding box 100 is constituted, the external air is taken into the shielding box 100 through the louver 102*a* of the shielding box 100 as shown in FIGS. 5 and 6. The air taken in by the cooling fan 30 is blown toward the circuit surface of the first wiring board 10 passing through the pair of flat cables 16 and 18. The air blown onto the circuit surface of the first wiring board 10 is so directed as to flow along the circuit surface of the first wiring board 10 toward the one side and the other side in the direction of extension of the space defined by the pair of flat cables 16 and 18 facing each other. The air is directed to flow along the circuit of the first wiring board 10 toward the one side in the direction of extension, flows along the circuit surface of the first wiring board 10 while cooling the surface of the CPU 32, and cools the electronic members arranged on the circuit surface of the first wiring board 10. The air is further directed to flow along the circuit of the first wiring board 10 toward the other side in the direction of extension, flows along the circuit surface of the first wiring board 10, and cools the electronic members arranged on the circuit surface of the first wiring board 10. Part of the air taken in by the cooling fan 30 flows along the circuit surface of the second wiring board 12, and cools the electronic members arranged on the circuit surface of the first wiring board 10. The air taken into the shielding box 100 is exhausted to the outer side through an exhaust hole (not shown) formed in the shielding box 100.

According to the shielding box 100 of the present invention as will be obvious from the foregoing description, the pair of flat cables 16 and 18 for electrically connecting the first wiring board 10 and the second wiring board 12 together, are arranged facing each other so as to obtain a function of the duct, making it possible to efficiently cool the CPU 32 by utilizing the existing members without providing any particular dedicated duct. The interior of the shielding box 100 can be cooled, too. According to the present invention, therefore, the CPU 32 is efficiently cooled by establishing a simple and compact constitution at a low cost avoiding an increase in the cost and, besides, the interior of the shielding box 100 is cooled, too.

Figure 8:
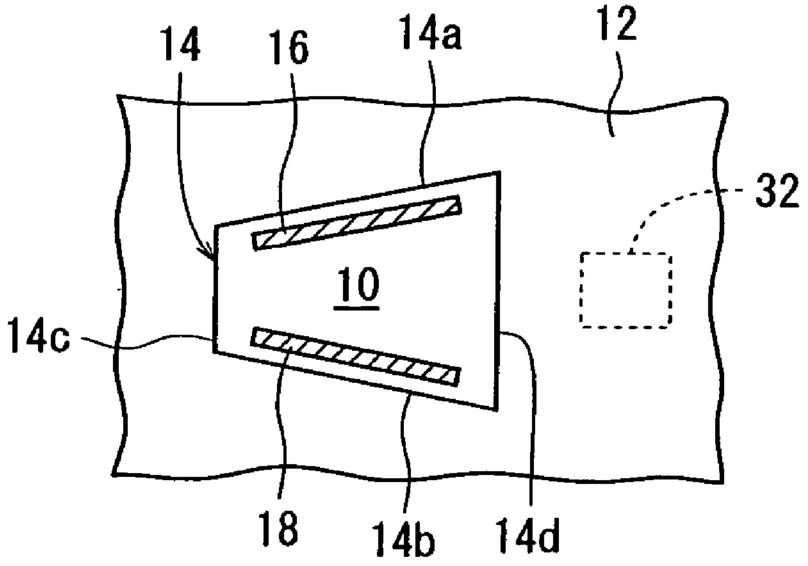
FIG. 8 is a partial sectional view schematically illustrating another embodiment of the present invention and corresponds to FIG. 7.

In the above embodiment, the ventilating hole 14 is formed in a rectangular shape as shown in FIG. 7. According to another embodiment, the ventilating hole 14, instead, is so formed that the one side surface 14*a* and the other side surface 14*b* facing each other in parallel are so arranged that the distance gradually increases from one end thereof (left end in FIG. 8) toward the other end thereof (right end in FIG. 8). In this embodiment, the pair of flat cables 16 and 18, too, are so arranged that the distance therebetween gradually increases from the one end thereof toward the other end thereof. As a result, the air blown onto the circuit surface of the first wiring board 10 is so directed as to flow much toward the broader side from the narrow side passing through the space defined by the pair of flat cables 16 and 18 facing each other. Therefore, the CPU 32 can be primarily cooled if it is disposed on the broader side on an extension of the space defined by the cables 16 and 18.

Figure 9:
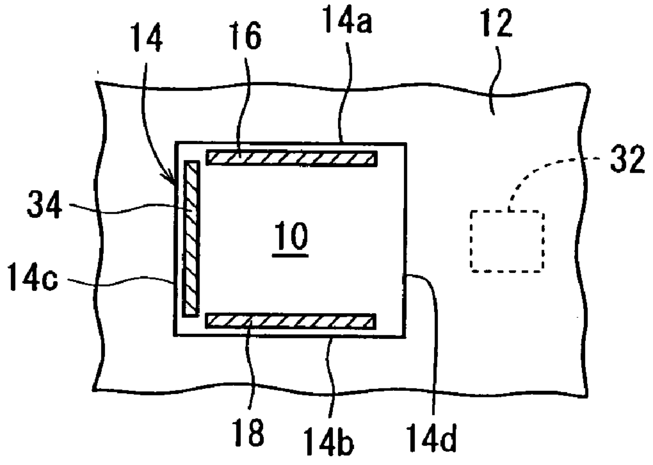
FIG. 9 is a partial sectional view schematically illustrating a further embodiment of the present invention and corresponds to FIG. 7.

In the above embodiment, the ventilating hole 14 of the second wiring board 12 has the one end surface 14*c* extending across the ends on one side of the one side surface 14*a* and of the other side surface 14*b*. FIG. 9 is a partial sectional view of a further embodiment in which a further flat cable 34 is arranged in addition to the pair of flat cables 16 and 18 to extend penetrating through the inside of the one end surface 14*c* of the ventilating hole 14. One end of the further flat cable 34 is connected to the circuit surface of the first wiring board 10 via a connector that is not shown, and the other end thereof is connected to the circuit surface of the second wiring board 12 via a connector that is not shown. The further flat cable 34 is so arranged as to substantially form a channel shape in transverse cross section in cooperation with the pair of flat cables 16 and 18. Like that of the pair of flat cables 16 and 18, the other end of the further flat cable 34 extends from the circuit surface of the second wiring board 12 mildly curving outwards facing the circuit surface, and is folded toward the back surface side. The other end of the flat cable 34 folded and heading to the circuit surface of the wiring board 12 is connected to the circuit of the second wiring board 12 via a connector that is not shown. One end of the flat cable 34 extends nearly at right angles with the circuit surface of the first wiring board 10, and is connected to the circuit of the first wiring board 10 via a connector that is not shown. In this embodiment, the air blown onto the circuit surface of the first wiring board 10 is directed in the space of the shape of a channel formed by the pair of flat cables 16 and 18 facing each other and by the further flat cable 34 toward the direction in which the channel shape is opening. Therefore, the CPU 32 can be more primarily cooled if it is disposed on an extension in the direction in which the channel shape is opened.

Figure 10:
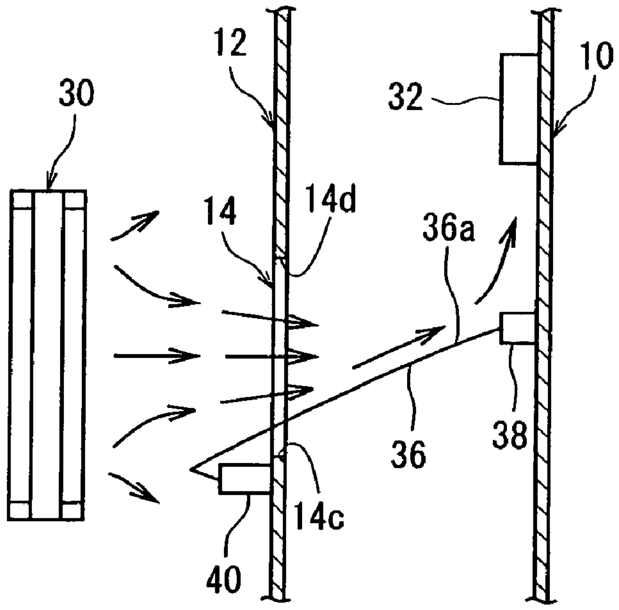
FIG. 10 is a longitudinal sectional view schematically illustrating a still further embodiment of the present invention and corresponds to FIG. 6.

FIG. 10 is a sectional view illustrating a still further embodiment of the present invention. In this embodiment, the ventilating hole 14 formed in the second wiring board 12 is substantially the same as the ventilating hole 14 illustrated in FIG. 7, and is formed in a rectangular shape having one side surface 14*a* and the other side surface 14*b* facing each other in parallel, and having one end surface 14*c* and the other end surface 14*d* facing each other in parallel. The circuit of the first wiring board 10 and the circuit of the second wiring board 12 are connected together through a flat cable 36. The flat cable 36 extends penetrating through the inside of the one end surface 14*c* of the ventilating hole 14, connected at its one end to the circuit surface of the first wiring board 10 via a connector 38 and is connected at its other end to the circuit surface of the second wiring board 12 via a connector 40. The flat cable 36 extends toward the circuit surface of the first wiring board 10 being tilted in a direction from one end surface 14*c* of the ventilating hole 14 toward the other end surface 14*d*. The CPU 32 is disposed on the first wiring board 10 at a position facing the inner tilted surface 36*a* of the flat cable 36 that faces the other end surface 14*d* of the ventilating hole 14. The other end of the flat cable 36 extends aslant from the circuit surface of the second wiring board 12 and is folded toward the back surface side. The other end of the flat cable 36 is folded and faces the circuit surface of the wiring board 12, and is connected to the circuit of the second wiring board 12 via a connector 40.

On the shielding box unit 100U, there is disposed a cooling fan 30 which is an axial fan so as to face the ventilating hole 14 in the axial direction in order to blow the external air to the circuit surface of the first wiring board 10 passing through the ventilating hole 14 along the inner tilted surface 36*a* of the flat cable 36.

Referring to FIG. 1, when the cooling fan 30 is rotated in a state where the shielding box 100 is constituted, the external air is taken into the shielding box 100 through the louver 102*a* of the shielding box 100. The air taken in by the cooling fan 30 flows through the ventilating hole 14 and is blown aslant onto the circuit surface of the first wiring board 10 along the inner tilted surface 36*a* of the flat cable 36. The air blown onto the circuit surface of the first wiring board 10 flows along the circuit surface of the first wiring board 10 while cooling the surface of the CPU 32, and cools other electronic members arranged on the circuit surface of the first wiring board 10. Part of the air taken in by the cooling fan 30 flows along the circuit surface of the second wiring board 12, and cools other electronic members arranged on the circuit surface of the first wiring board 10. The air taken into the shielding box 100 is exhausted to the outer side through an exhaust hole (not shown) formed in the shielding box 100.

According to the embodiment illustrated in FIG. 10 as will be obvious from the foregoing description, the tilted flat cable 36 for electrically connecting the first wiring board 10 and the second wiring board 12 together, is utilized as a guide for flowing the air taken in by the cooling fan 30 toward the CPU 32, making it possible to primarily and efficiently cool the CPU 32 by utilizing the existing members without providing any particular dedicated duct. The interior of the shielding box 100 can be cooled, too. According to this embodiment, therefore, the CPU 32 is primarily and efficiently cooled by establishing a simple and compact constitution at a low cost avoiding an increase in the cost and, besides, the interior of the shielding box 100 is cooled, too.

In the above embodiment, the first wiring board 10 and the second wiring board 12 are disposed so as to constitute a two-layer structure in the shielding box 100. According to a yet further embodiment, a further wiring board is arranged between the first wiring board 10 and the second wiring board 12 to constitute a three- or more-layer structure. In this embodiment, a further ventilating hole is formed in the further wiring board at a position corresponding to the ventilating hole 14 in the second wiring board 12, the further ventilating hole having side surfaces substantially facing each other, and the pair of flat cables 16 and 18 are so constituted as to extend penetrating through the inside of the side surfaces of the further ventilating hole. According to a further embodiment, the ventilating hole in the second wiring board 12 and the ventilating hole in the further wiring board, respectively, have end surfaces extending across the ends on one side of the side surfaces, a further flat cable is arranged in addition to the pair of flat cables to extend penetrating through the inner side of the end surfaces of the ventilating holes, the further flat cable being connected at its one end to the first wiring board 10 and being connected at its other end to the second wiring board 12. Moreover, the further flat cable is so arranged as to substantially form a channel shape in transverse cross section in cooperation with the pair of flat cables. According to another embodiment, a further wiring board is disposed between the first wiring board 10 and the second wiring board 12, a further ventilating hole having the side surfaces substantially facing each other is formed in the further wiring board at a position corresponding to the ventilating hole 14 of the second wiring board 12, and a flat cable extends penetrating through the inside of the one side surface of the further ventilating hole. As described above, the present invention can further be applied even to the shielding box in which the wiring substrates are arranged in three or more layers.

As described above, the present invention makes it possible to primarily an efficiently cool the CPU 32 disposed on the first wiring board 10 at a place where it can be cooled relatively less in the shielding box 100. In the present invention, however, the member that needs be primarily and efficiently cooled is not limited to the CPU 32 only but may be any other particular member that must be primarily and efficiently cooled.

The invention claimed is:

1. A shielding box including a first wiring board and a second wiring board maintaining a distance relative to the first wiring board and facing thereto in parallel, the shielding box further comprising:

a ventilating hole formed in the second wiring board and having side surfaces substantially facing each other;

a pair of flat cables extending through the insides of said side surfaces of the ventilating hole and facing each other maintaining a distance, the ends on one side thereof being connected to the first wiring board and the ends on the other side thereof being connected to the second wiring board; and a cooling fan disposed so as to be faced to the ventilating hole and blows external air toward the first wiring board passing along the pair of flat cables.

2. A shielding box according to claim 1, wherein a particular member that needs cooling is disposed on an extension of a space defined by the pair of flat cables facing each other.

3. A shielding box according to claim 2, wherein the particular member that needs cooling is a central processing unit (CPU).

4. A shielding box according to claim 1, wherein said side surfaces of the ventilating hole are extending in parallel with each other.

5. A shielding box according to claim 1, wherein said side surfaces of the ventilating hole are so formed that the distance therebetween gradually increases from the ends on one side to the ends on the other side.

6. A shielding box according to claim 1, wherein the ventilating hole in the second wiring board has one end surface extending across the ends on one side of the side surfaces thereof, another flat cable is disposed in addition to the pair of flat cables, the another flat cable extending through the inside of the one end surface of the ventilating hole and being connected at its one end to the first wiring board and connected at its other end to the second wiring board, and the another flat cable being so disposed as to substantially form a channel shape in transverse cross section in cooperation with the pair of flat cables.

7. A shielding box including a first wiring board and a second wiring board maintaining a distance relative to the first wiring board and facing thereto in parallel, the shielding box further comprising:

a ventilating hole formed in the second wiring board and having side surfaces substantially facing each other;

a flat cable extending through the inside of one of said side surfaces of the ventilating hole, the end on one side thereof being connected to the first wiring board and the end on the other side thereof being connected to the second wiring board; and a cooling fan disposed so as to be faced to the ventilating hole and blows external air toward the first wiring board through the ventilating hole along the flat cable.

8. A shielding box according to claim 7, wherein the flat cable is extending toward the first wiring board being tilted from one side surface of the ventilating hole toward the other side thereof.

9. A shielding box according to claim 7, wherein a particular member that needs cooling is disposed on the first wiring board at a position facing the inner side surface of the flat cable that faces the other side surface of the ventilating hole.

10. A shielding box according to claim 9, wherein the particular member that needs cooling is a CPU.

* * * * *